(12) United States Patent
Mitchell

(10) Patent No.: US 10,971,327 B1
(45) Date of Patent: Apr. 6, 2021

(54) CRYOGENIC HEAT TRANSFER SYSTEM

(71) Applicant: APPLIED Materials, Inc., Santa Clara, CA (US)

(72) Inventor: Robert J. Mitchell, Winchester, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/705,634

(22) Filed: Dec. 6, 2019

(51) Int. Cl.
 *H01J 37/20* (2006.01)
 *C23C 14/54* (2006.01)
 *C23C 14/48* (2006.01)
 *H01J 37/317* (2006.01)

(52) U.S. Cl.
 CPC .............. H01J 37/20 (2013.01); C23C 14/48 (2013.01); C23C 14/541 (2013.01); H01J 37/3171 (2013.01); *H01J 2237/002* (2013.01); *H01J 2237/20214* (2013.01)

(58) Field of Classification Search
 CPC .......... H01J 2237/002; H01J 37/32715; H01J 2237/2007; H01J 37/20; H01L 21/6833; H01L 21/68792; H01L 21/68764; C23C 14/541; C23C 16/4586
 USPC .......... 250/442.11, 443.1, 398, 492.1, 492.2
 See application file for complete search history.

(56) References Cited

U.S. PATENT DOCUMENTS

| 3,171,955 | A | * | 3/1965 | Cardile | H01J 37/20 |
| | | | | | 250/443.1 |
| 4,284,894 | A | * | 8/1981 | Sitte | A61B 10/00 |
| | | | | | 250/443.1 |
| 4,680,061 | A | * | 7/1987 | Lamont, Jr. | C23C 14/34 |
| | | | | | 204/192.12 |
| 5,124,557 | A | * | 6/1992 | Aitken | H01L 21/68 |
| | | | | | 250/442.11 |

(Continued)

FOREIGN PATENT DOCUMENTS

| EP | 3118883 A1 | 1/2017 |
| JP | 2012-099298 A | 5/2012 |

OTHER PUBLICATIONS

International Search Report dated Feb. 17, 2021, for the International Patent Application No. PCT/US2020/057251, filed on Oct. 25, 2020, 4 pages.

(Continued)

*Primary Examiner* — David A Vanore
(74) *Attorney, Agent, or Firm* — Kacvinsky Daisak Bluni PLLC

(57) ABSTRACT

A cryogenic heat transfer system including a platen supported by a rotatable shaft, a housing surrounding a portion of the rotatable shaft, the housing including an annular heat sink surrounding the rotatable shaft and defining a heat transfer gap between the heat sink and the rotatable shaft, the heat sink including a fluid conduit extending therethrough for circulating a first cooling fluid through the heat sink, a first dynamic seal arrangement extending from a first axial end of the heat sink and surrounding the rotatable shaft, and (Continued)

a second dynamic seal arrangement extending from a second axial end of the heat sink opposite the first axial end and radially surrounding the rotatable shaft, wherein the heat sink and the first and second dynamic seal arrangements define a fluidically sealed volume surrounding the rotatable shaft, the fluidically sealed volume containing a second cooling fluid.

20 Claims, 1 Drawing Sheet

(56) References Cited

U.S. PATENT DOCUMENTS

| | | | |
|---|---|---|---|
| 6,583,428 B1 | 6/2003 | Chipman et al. | |
| 9,177,708 B2 * | 11/2015 | Barraclough | H05K 7/20 |
| 9,275,820 B2 * | 3/2016 | Lee | H01J 37/08 |
| 2004/0026871 A1 * | 2/2004 | Stephens | F16J 15/3404 |
| | | | 277/401 |
| 2009/0140166 A1 | 6/2009 | Muka | |
| 2016/0042923 A1 * | 2/2016 | Suh | H01J 37/32715 |
| | | | 118/723 R |
| 2017/0304849 A1 * | 10/2017 | Fovell | H01J 37/32449 |
| 2019/0181028 A1 * | 6/2019 | Patel | H01J 37/32724 |
| 2019/0318912 A1 * | 10/2019 | Umehara | H01J 37/32165 |
| 2019/0378696 A1 * | 12/2019 | Addepalli | H01J 37/3244 |
| 2020/0090973 A1 * | 3/2020 | Launay | H01L 21/67069 |
| 2020/0111686 A1 * | 4/2020 | Mitchell | H01L 21/67109 |
| 2020/0176215 A1 * | 6/2020 | Gosen | H01J 37/141 |
| 2020/0185249 A1 * | 6/2020 | Rice | H01L 21/68757 |
| 2020/0373133 A1 * | 11/2020 | Hatano | C23C 14/505 |
| 2020/0388472 A1 * | 12/2020 | Takayama | H02N 13/00 |
| 2020/0411355 A1 * | 12/2020 | Noorbakhsh | H01J 37/32724 |

OTHER PUBLICATIONS

Written Opinion dated Feb. 17, 2021, for the International Patent Application No. PCT/US2020/057251, filed on Oct. 25, 2020, 3 pages.

* cited by examiner

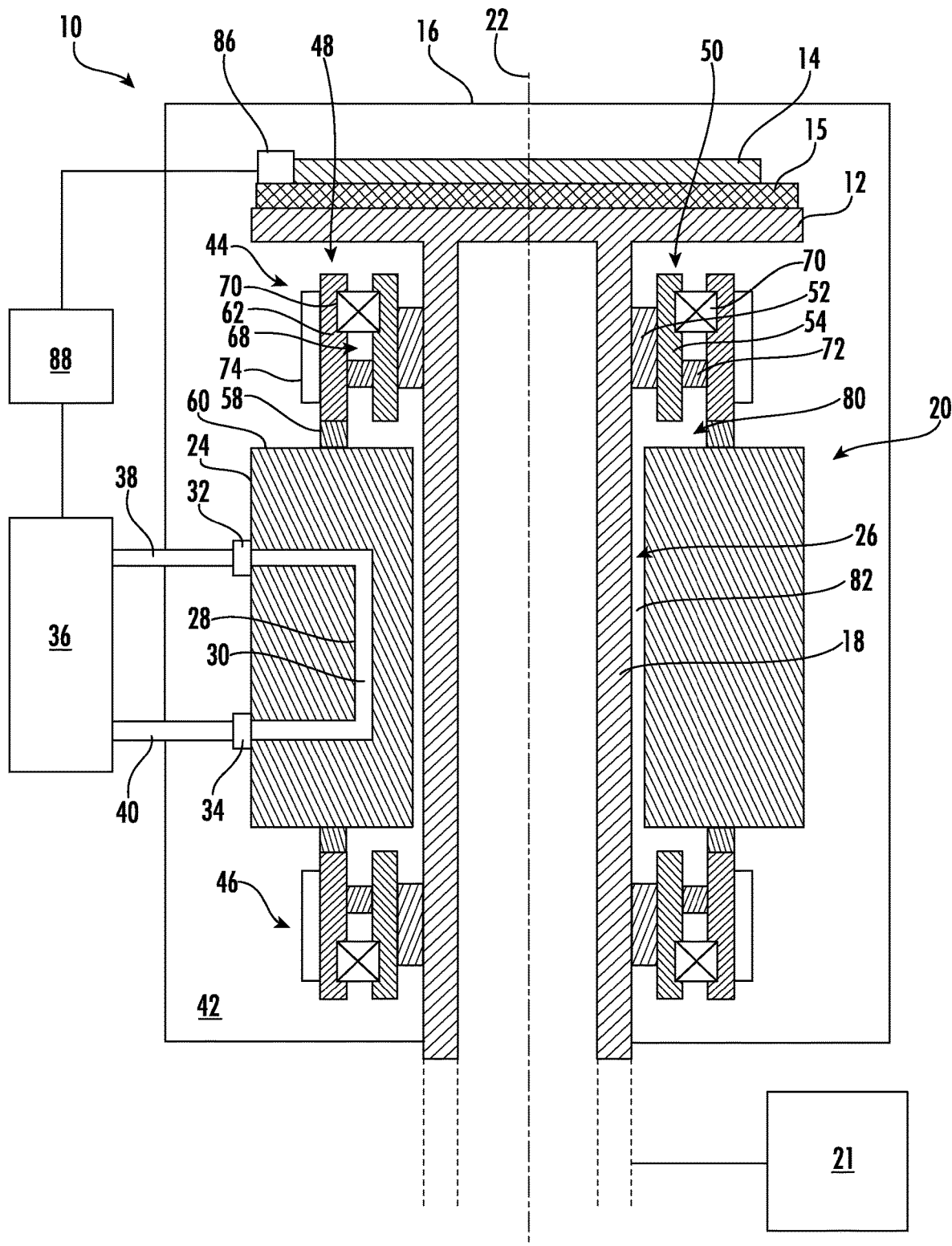

CRYOGENIC HEAT TRANSFER SYSTEM

FIELD OF THE DISCLOSURE

Embodiments of the present disclosure relate generally to the field of semiconductor processing equipment, and more particularly to a cryogenic heat transfer system for cooling rotatable platens used in ion implantation processes.

BACKGROUND OF THE DISCLOSURE

Ion implantation is a standard technique for introducing property-altering impurities into substrates. During an ion implantation process, a desired impurity material ("dopant") is ionized in a source chamber and the ions are directed through an extraction aperture. The ions are accelerated to form an ion beam of prescribed energy, and the ion beam is directed onto the surface of a substrate disposed on a rotatable platen in a process chamber. The energetic ions in the ion beam penetrate the sub-surface of the substrate material and are embedded into the crystalline lattice of the substrate material to form a region of desired conductivity or material property.

In some ion implantation processes, a desired implantation profile is achieved by implanting ions into a target substrate at low temperatures (e.g., between −100 and −200 degrees Celsius). Cooling the target substrate to such temperatures can be achieved by supporting the substrate on a cooled platen during the ion implantation process. Typically, a platen is cooled by circulating a cooling fluid (e.g., helium or nitrogen) around, and in direct contact with, a shaft of the platen at high pressure. In the case of a rotatable platen, a dynamic fluid seal is implemented around the shaft for preventing the cooling fluid from leaking into the process environment of the substrate while allowing the shaft to be rotated. Such seals are typically very complex, difficult to implement, and are prone to leakage when confronted with fluids at high pressure. Thus, such seals practically limit the options for cooling fluids to those amenable to being sealed with minimal or no risk of significant leakage. For example, while liquids and certain gases such as helium may be optimal choices for use as cooling fluids, less effective gases such as nitrogen are often selected because they are easier to seal at high pressure.

With respect to these and other considerations the present improvements may be useful.

SUMMARY

This Summary is provided to introduce a selection of concepts in a simplified form. This Summary is not intended to identify key features or essential features of the claimed subject matter, nor is this Summary intended as an aid in determining the scope of the claimed subject matter.

An embodiment of a cryogenic heat transfer system in accordance with the present disclosure may include a platen supported by a rotatable shaft, a housing surrounding a portion of the rotatable shaft, the housing including an annular heat sink surrounding the rotatable shaft and defining a heat transfer gap between the heat sink and the rotatable shaft, the heat sink including a fluid conduit extending therethrough for circulating a first cooling fluid through the heat sink, a first dynamic seal arrangement extending from a first axial end of the heat sink and surrounding the rotatable shaft, and a second dynamic seal arrangement extending from a second axial end of the heat sink opposite the first axial end and radially surrounding the rotatable shaft, wherein the heat sink and the first and second dynamic seal arrangements define a fluidically sealed volume surrounding the rotatable shaft, the fluidically sealed volume containing a second cooling fluid.

Another embodiment of a cryogenic heat transfer system in accordance with the present disclosure may include a platen supported by a rotatable shaft, a drive mechanism coupled to the rotatable shaft for rotating the rotatable shaft, a housing surrounding a portion of the rotatable shaft, the housing including an annular heat sink surrounding the rotatable shaft and defining a heat transfer gap between the heat sink and the rotatable shaft, the heat sink including a fluid conduit extending therethrough for circulating a first cooling fluid through the heat sink. The housing may further include a first dynamic seal arrangement extending from a first axial end of the heat sink and surrounding the rotatable shaft, the first dynamic seal arrangement including a first rotary bearing member affixed to the rotatable shaft and a first stationary bearing member surrounding the first rotary bearing member and affixed to the heat sink, wherein the first rotary bearing member and the first stationary bearing member cooperate to form a fluid-tight seal surrounding rotatable shaft while allowing the rotatable shaft to be rotated, and a second dynamic seal arrangement extending from a second axial end of the heat sink opposite the first axial end and radially surrounding the rotatable shaft, the second dynamic seal arrangement including a second rotary bearing member affixed to the rotatable shaft and a second stationary bearing member surrounding the second rotary bearing member and affixed to the heat sink, wherein the second rotary bearing member and the second stationary bearing member cooperate to form a fluid-tight seal surrounding rotatable shaft while allowing the rotatable shaft to be rotated. The heat sink and the first and second dynamic seal arrangements define a fluidically sealed volume surrounding the rotatable shaft, the fluidically sealed volume containing a second cooling fluid, wherein a fluid pressure of the first cooling fluid is greater than a fluid pressure of the second cooling fluid.

An embodiment of ion implantation system in accordance with the present disclosure may include a process chamber defining an enclosed process environment, a platen supported by a rotatable shaft disposed within the process chamber, a housing surrounding a portion of the rotatable shaft, the housing including an annular heat sink surrounding the rotatable shaft and defining a heat transfer gap between the heat sink and the rotatable shaft, the heat sink including a fluid conduit extending therethrough for circulating a first cooling fluid through the heat sink, a first dynamic seal arrangement extending from a first axial end of the heat sink and surrounding the rotatable shaft, and a second dynamic seal arrangement extending from a second axial end of the heat sink opposite the first axial end and radially surrounding the rotatable shaft. The heat sink and the first and second dynamic seal arrangements define a fluidically sealed volume surrounding the rotatable shaft, the fluidically sealed volume containing a second cooling fluid. The ion implantation system may further include a chilling unit connected to the fluid conduit by fluid lines and adapted to cool the first cooling fluid, wherein the chilling unit, the fluid lines, and the fluid conduit define a stationary, closed-loop fluid circuit fluidically sealed from the process environment

BRIEF DESCRIPTION OF THE DRAWINGS

By way of example, various embodiments of the disclosed system will now be described, with reference to the accompanying drawings, wherein:

FIG. 1 is a schematic, cross-sectional side view illustrating a cryogenic heat transfer system in accordance with a non-limiting embodiment of the present disclosure.

DETAILED DESCRIPTION

The present embodiments will now be described more fully hereinafter with reference to the accompanying drawings, wherein some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

In accordance with the present disclosure, a cryogenic heat transfer system is provided and will be described in detail below. The cryogenic heat transfer system of the present disclosure may facilitate cooling of a rotatable platen in an ion implantation system while eliminating or greatly reducing the risk of leaking highly pressurized cooling fluid into a process environment of the ion implantation system. A dynamic fluid seal of the provided cryogenic heat transfer system needs merely to contain a cooling fluid held at low pressure, thus reducing the difficultly and complexity associated with implementing the dynamic fluid seal relative to dynamic fluid seals typically implemented in conventional cooled, rotatable platens.

Referring to FIG. 1, a cross-sectional side view of a cryogenic heat transfer system 10 (hereinafter "the system 10") in accordance with a non-limiting, exemplary embodiment of the present disclosure is shown. For the sake of convenience and clarity, terms such as "top," "bottom," "above," "below," "lower," "upper," "downward," "upward," "vertical," "axial," and "radial" may be used below to describe the relative placement and orientation of various components of the system 10, all with respect to the geometry and orientation of the system 10 as depicted in FIG. 1. Said terminology will include the words specifically mentioned, derivatives thereof, and words of similar import.

The system 10 may include a generally planar, disc-shaped platen 12 adapted to hold a substrate 14 (e.g., a semiconductor wafer) in a process chamber 16 of an ion implantation system. The platen 12 may include an electrostatic clamp 15 disposed thereon, or otherwise integrated therewith, for facilitating secure clamping of the substrate 14 to the platen 12. The electrostatic clamp 15 may be of any variety familiar to those of ordinary skill in the art and is not germane to the present disclosure. In various alternative embodiments, a mechanical clamp may be substituted for the electrostatic clamp 15. The present disclosure is not limited in this regard. The platen 12 may be supported by a rotatable shaft 18 extending perpendicularly from a bottom surface of the platen 12. In various embodiments, the platen 12 and the shaft 18 may be separate components mechanically coupled together, or may be constituent portions of a contiguous, unitary structure (e.g., formed from a contiguous piece of material). The platen 12 and the shaft 18 may be formed of aluminum, alumina, stainless steel, or other materials having similarly good thermal conductivity (e.g., thermal conductivity above 175 watts per meter kelvin). The present disclosure is not limited in this regard.

The shaft 18 of the system 10 may be rotatably mounted within a housing 20 and may be coupled to a drive mechanism 21 (e.g., a rotary drive motor and pulley arrangement, a direct drive rotary motor, etc.) adapted to controllably rotate the shaft 18 and the platen 12 around a vertical axis 22. The housing 20 may be adapted to cool the shaft 18 and the platen 12 while allowing the shaft 18 and the platen 12 to be rotated by the drive mechanism 21. The housing 20 may include a generally annular or cylindrical heat sink 24 radially surrounding the shaft 18 in a close clearance relationship therewith. An interior surface of the heat sink 24 and an exterior surface of the shaft 18 may be generally coaxial and may define a heat transfer gap 26 therebetween. In various embodiments, the heat transfer gap 26 may have a width in a range of 25 microns to 150 microns. The present disclosure is not limited in this regard. The heat sink 24 may be formed of aluminum, alumina, stainless steel, or other materials having similarly good thermal conductivity (e.g., thermal conductivity above 175 watts per meter kelvin). In various embodiments the heat sink and the shaft 18 may be formed of the same material (or materials having the same or similar coefficients of thermal expansion) for maintaining the width of the heat transfer gap regardless of temperature.

The heat sink 24 may include a fluid conduit 28 extending therethrough for circulating a first cooling fluid 30 through the heat sink 24 as further described below. The first cooling fluid 30 may be any liquid or gas suitable for cooling the heat sink 24. Such liquids and gases include, and are not limited to, liquid or gaseous nitrogen, liquid or gaseous helium, neon, etc. The fluid conduit 28 may have a fluid inlet port 32 and a fluid outlet port 34 connected to a chilling unit 36 by fluid lines 38, 40, respectively. The chilling unit 36 may cool the first cooling fluid 30 to a predetermined temperature and may pump the first cooling fluid 30 through the fluid conduit 28 at high pressure (e.g., 2,500 Torr-10,000 Torr) for cooling the heat sink 24. In various embodiments, the chilling unit 36 may be a commercial chiller (e.g., a Cold Helium Circulation System sold by CRYOMECH). The chilling unit 36, fluid lines 38, 40, and fluid conduit 28 may define a stationary, closed-loop fluid circuit fluidically sealed from a process environment 42 within the process chamber 16. Thus, the chilling unit 36 may circulate the first cooling fluid 30 through the heat sink 24 at high pressure with no risk (or with very little risk) of the first cooling fluid 30 being leaked into the process environment 42.

While the fluid conduit 28 is depicted in FIG. 1 as being generally U-shaped, various alternative embodiments are contemplated wherein the fluid conduit 28 may define a curvilinear, helical, irregular, or tortuous path through the heat sink 24. Additionally, the fluid conduit may, in some embodiments, extend entirely around the shaft 18 one or more times. Moreover, while one fluid conduit 28 is depicted in FIG. 1, various alternative embodiments of the present disclosure are contemplated wherein the heat sink 24 may include a plurality of fluid conduits extending therethrough. The present disclosure is not limited in this regard.

The housing 20 may further include first and second dynamic seal arrangements 44, 46 disposed on opposing axial sides of the heat sink 24 (i.e., top and bottom sides of the heat sink 24 as depicted in FIG. 1) and radially surrounding the shaft 18. The first and second dynamic seal arrangements 44, 46 may be generally identical, mirror images of one another (i.e., vertically inverted relative to one another). Thus, for the sake of brevity, the first dynamic seal arrangement 44 shall be described in detail below, and such description shall also apply to the second dynamic seal arrangement 46. The reference numerals assigned to various components of the first dynamic seal arrangement 44 shall also refer to the corresponding components of the second dynamic seal arrangement 44.

The first dynamic seal arrangement 44 may include a rotary bearing member 48 affixed to the shaft 18, and a stationary bearing member 50 radially surrounding the rotary bearing member 48. The rotary bearing member 48 may include an annular, first thermal insulator 52 coupled directly to the exterior surface of the shaft 18. In various examples, the first thermal insulator 52 may be coupled to the shaft 18 by welding, brazing, various thermally insulating adhesives, various mechanical fasteners (e.g., screws, bolts, etc.), clamping, etc. The first thermal insulator 52 may be formed of ceramic, plastic, or other materials having similarly poor thermal conductivity (e.g., thermal conductivity below 20 watts per meter kelvin). The present disclosure is not limited in this regard.

The rotary bearing member 48 may further include a rotary bearing support 54 radially surrounding, and coupled to, the first thermal insulator 52. The rotary bearing support 54 may be formed of stainless steel, for example, and may be coupled to the first thermal insulator 52 by welding, brazing, various thermally insulating adhesives, various mechanical fasteners, etc. In an alternative embodiment, the rotary bearing support 54 and the first thermal insulator 52 may be constituent portions of a contiguous, unitary structure (e.g., formed from a contiguous piece of material). The present disclosure is not limited in this regard.

The stationary bearing member 50 of the first dynamic seal arrangement 44 may axially extend from the heat sink 24 and may radially surround the rotary bearing member 48. The stationary bearing member 50 may include an annular, second thermal insulator 58 coupled to an axial end face 60 of the heat sink 24. In various examples, the second thermal insulator 58 may be coupled to the heat sink by welding, brazing, various thermally insulating adhesives, various mechanical fasteners (e.g., screws, bolts, etc.), clamping, etc. Like the first thermal insulator 52, the second thermal insulator 58 may be formed of ceramic, plastic, or other materials having similarly poor thermal conductivity (e.g., thermal conductivity below 20 watts per meter kelvin). The present disclosure is not limited in this regard.

The stationary bearing member 50 may further include a stationary bearing support 62 axially extending from, and coupled to, the second thermal insulator 58. Like the rotary bearing support 54, the stationary bearing support 62 may be formed of stainless steel, for example, and may be coupled to the second thermal insulator 58 by welding, brazing, various thermally insulating adhesives, various mechanical fasteners, etc. In an alternative embodiment, the stationary bearing support 62 and the second thermal insulator 58 may be constituent portions of a contiguous, unitary structure (e.g., formed from a contiguous piece of material). The present disclosure is not limited in this regard.

A radially inwardly-facing surface of the stationary bearing support 62 may be disposed in a parallel, spaced-apart, confronting relationship with a radially outwardly-facing surface of the rotary bearing support 54 to define a gap 68 therebetween. Bearings 70 may be disposed within the gap 68 and may engage (e.g., may be "sandwiched" between) the radially confronting surfaces of the stationary bearing support 62 and the rotary bearing support 54. In various embodiments, the bearings 70 may be disposed within complementary recesses formed in the radially confronting surfaces of the stationary bearing support 62 and the rotary bearing support 54 as shown in FIG. 1. As will be appreciated by those of ordinary skill in the art, the bearings 70 may facilitate smooth, relatively low-friction rotation of the rotary bearing member 48 and the attached shaft 18 relative to the stationary bearing member 50. An annular, dynamic fluid seal 72 may be disposed within the gap 68 axially inward of (i.e., nearer the heat sink 24 relative to) the bearings 70. The dynamic fluid seal 72 may provide a fluid-tight seal between the radially confronting surfaces of the stationary bearing support 62 and the rotary bearing support 54 while allowing the rotary bearing member 48 to be rotated relative to the stationary bearing member 50. In various embodiments, the dynamic fluid seal 72 may be, or may include, any type of dynamic sealing arrangement, including, and not limited to, a ferrofluid rotary seal, a mechanical lip seal, etc. The present disclosure is not limited in this regard.

In various embodiments, the stationary bearing member 50 may further include one or more heaters 74 coupled to the stationary bearing support 62. The heater 74 may regulate the temperature of the first dynamic seal arrangement 44 to prevent cooling from the heat sink 24 and/or the shaft 18 from interfering with operation of the dynamic fluid seal 72. In various embodiments, the heater 74 may be any type of resistive heater suitable for implementation in the process environment 42, including, and not limited to, a conventional surface heater. Alternative embodiments of the present disclosure are contemplated wherein the heater 74 may be omitted.

As described above, the second dynamic seal arrangement 46 may be generally identical to (but vertically inverted relative to) the first dynamic seal arrangement 44. Thus, the first dynamic seal arrangement 44, the heat sink 24, and the second dynamic seal arrangement 46 may together define a fluidically sealed volume 80 surrounding the shaft 18. The volume 80 may contain a second cooling fluid 82 held at a relatively lower fluid pressure compared to the fluid pressure of the first cooling fluid 30 circulating through the heat sink 24. For example, the second cooling fluid 82 may be held at a fluid pressure in a range between 20 Torr to 60 Torr. The preset disclosure is not limited in this regard. The second cooling fluid 82 may be the same as or different from the first cooling fluid 30 and may be any liquid or gas suitable for providing an effective thermally conductive medium for transferring heat from the shaft 18 to the heat sink 24. In various embodiments, the second cooling fluid 82 may be liquid or gaseous nitrogen, liquid or gaseous helium, neon, etc. The present disclosure is not limited in this regard.

During normal operation of the system 10, the chilling unit 36 may pump the first cooling fluid 30 through the fluid conduit 28 to cool the heat sink 24 as described above. In various embodiments, the heat sink 24 may be cooled to a temperature of −150 degrees Celsius or below. The present disclosure is not limited in this regard. The cooled heat sink 24 may in-turn cool the second cooling fluid 82 in the adjacent volume 80 surrounding the shaft 18, and the cooled second cooling fluid 82 may in-turn cool the shaft 18 and the platen 12, in-turn cooling the substrate 14 disposed on the platen 12. Particularly, heat may be communicated from the substrate 14 to the platen 12 and the shaft 18, then from the shaft 18 through the second cooling fluid 82 in the narrow heat transfer gap 26 to the heat sink 24, where the heat is then carried away to the chilling unit 36 by the first cooling fluid 30. Simultaneously, the housing 20, and particularly the first and second dynamic seal arrangements 44, 46, may allow the shaft 18 and the platen to be freely rotated by the drive mechanism 21. Owing to the relatively low pressure of the second cooling fluid 82, the dynamic fluid seals 72 of the first and second dynamic seal arrangements 44, 46 may effectively retain the second cooling fluid 82 within the volume 80 with no risk (or very little risk) of the second cooling fluid 82 being leaked into the process environment 42.

In various embodiments, the system 10 may further include a temperature sensor 86 (e.g., a thermocouple, thermistor, etc.) for measuring a temperature of the substrate 14. The measured temperature may be communicated to a controller 88 (e.g., a programmable logic controller, microcontroller, etc.) operatively connected to the chilling unit 36. The controller 88 may dictate various operational parameters of the chilling unit 36 based on the measured temperature in order to control the cooling provided by the chilling unit 36 to achieve a predetermined temperature in the substrate 14. Such parameters may include, and are not limited to, a cooling temperature and a flow rate of the chilling unit 36.

In view of the above description, the cryogenic heat transfer system of the present disclosure provides an advantage in the art by facilitating cooling of a rotatable platen in an ion implantation system while eliminating or greatly mitigating the risk of leaking highly pressurized cooling fluid into a process environment of the ion implantation system. The cryogenic heat transfer system of the present disclosure provides a further advantage by allowing numerous different cooling fluids to be selected for circulating around a shaft of a rotatable platen since such cooling fluids are maintained at a low fluid pressure and can thus be easily and effectively sealed from a process environment using dynamic fluid seals. As a further advantage, and also because the cooling fluids surrounding the shaft are maintained at a low fluid pressure, the difficulty and complexity associated with implementing the dynamic fluid seals are reduced relative to dynamic fluid seals typically implemented in conventional cooled, rotatable platens.

As used herein, an element or step recited in the singular and proceeded with the word "a" or "an" will be understood as not excluding plural elements or steps, except if such exclusion is explicitly recited. Furthermore, references to "one embodiment" of the present disclosure are not intended to be interpreted as excluding the existence of additional embodiments incorporating the recited features.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, while the present disclosure has been described herein in the context of a particular implementation in a particular environment for a particular purpose, those of ordinary skill in the art will recognize its usefulness is not limited thereto. Embodiments of the present disclosure may be beneficially implemented in any number of environments for any number of purposes. Accordingly, the claims set forth below shall be construed in view of the full breadth and spirit of the present disclosure as described herein.

The invention claimed is:

1. A cryogenic heat transfer system comprising:
    a platen supported by a rotatable shaft; and
    a housing surrounding a portion of the rotatable shaft, the housing comprising:
        an annular heat sink surrounding the rotatable shaft and defining a heat transfer gap between the heat sink and the rotatable shaft, the heat sink including a fluid conduit extending therethrough for circulating a first cooling fluid through the heat sink;
        a first dynamic seal arrangement extending from a first axial end of the heat sink and surrounding the rotatable shaft; and
        a second dynamic seal arrangement extending from a second axial end of the heat sink opposite the first axial end and radially surrounding the rotatable shaft;
    wherein the heat sink and the first and second dynamic seal arrangements define a fluidically sealed volume surrounding the rotatable shaft, the fluidically sealed volume containing a second cooling fluid.

2. The cryogenic heat transfer system of claim 1, wherein the heat transfer gap has a width in a range of 25 microns to 150 microns.

3. The cryogenic heat transfer system of claim 1, wherein a fluid pressure of the first cooling fluid is greater than a fluid pressure of the second cooling fluid.

4. The cryogenic heat transfer system of claim 3, wherein a fluid pressure of the first cooling fluid is in a range of 2,500 Torr to 10,000 Torr and a fluid pressure of the second cooling fluid is in a range of 20 Torr to 60 Torr.

5. The cryogenic heat transfer system of claim 1, wherein the first cooling fluid is one of nitrogen, helium, and neon.

6. The cryogenic heat transfer system of claim 1, wherein the second cooling fluid is one of nitrogen, helium, and neon.

7. The cryogenic heat transfer system of claim 1, further comprising a chilling unit connected to the fluid conduit and adapted to cool the first cooling fluid.

8. The cryogenic heat transfer system of claim 1, wherein the rotatable shaft and the heat sink are formed of the same material.

9. The cryogenic heat transfer system of claim 1, wherein the rotatable shaft is formed of a first material and the heat sink is formed of a second material different from the first material, wherein a coefficient of thermal expansion of the first material is equal to a coefficient of thermal expansion of the second material.

10. The cryogenic heat transfer system of claim 1, wherein the first dynamic seal arrangement includes a rotary bearing member affixed to the rotatable shaft and a stationary bearing member surrounding the rotary bearing member and affixed to the heat sink, wherein the rotary bearing member and the stationary bearing member cooperate to form a fluid-tight seal surrounding rotatable shaft while allowing the rotatable shaft to be rotated.

11. A cryogenic heat transfer system comprising:
    a platen supported by a rotatable shaft;
    a drive mechanism coupled to the rotatable shaft for rotating the rotatable shaft; and
    a housing surrounding a portion of the rotatable shaft, the housing comprising:
        an annular heat sink surrounding the rotatable shaft and defining a heat transfer gap between the heat sink and the rotatable shaft, the heat sink including a fluid conduit extending therethrough for circulating a first cooling fluid through the heat sink;
        a first dynamic seal arrangement extending from a first axial end of the heat sink and surrounding the rotatable shaft, the first dynamic seal arrangement including a first rotary bearing member affixed to the rotatable shaft and a first stationary bearing member surrounding the first rotary bearing member and affixed to the heat sink, wherein the first rotary bearing member and the first stationary bearing member cooperate to form a fluid-tight seal surrounding rotatable shaft while allowing the rotatable shaft to be rotated; and a second dynamic seal arrangement extending from a second axial end of the heat sink opposite the first axial end and radially surrounding the rotatable shaft, the second dynamic seal arrangement including a second rotary bearing member affixed to the rotatable shaft and a second stationary bearing member surrounding the second rotary bearing member and affixed to the heat sink, wherein the second rotary bearing member and the second stationary bearing member cooperate to form a fluid-tight seal surrounding rotatable shaft while allowing the rotatable shaft to be rotated;

wherein the heat sink and the first and second dynamic seal arrangements define a fluidically sealed volume surrounding the rotatable shaft, the fluidically sealed volume containing a second cooling fluid, and wherein a fluid pressure of the first cooling fluid is greater than a fluid pressure of the second cooling fluid.

12. An ion implantation system comprising:

a process chamber defining an enclosed process environment;

a platen supported by a rotatable shaft disposed within the process chamber;

a housing surrounding a portion of the rotatable shaft, the housing comprising:

an annular heat sink surrounding the rotatable shaft and defining a heat transfer gap between the heat sink and the rotatable shaft, the heat sink including a fluid conduit extending therethrough for circulating a first cooling fluid through the heat sink;

a first dynamic seal arrangement extending from a first axial end of the heat sink and surrounding the rotatable shaft; and a second dynamic seal arrangement extending from a second axial end of the heat sink opposite the first axial end and radially surrounding the rotatable shaft;

wherein the heat sink and the first and second dynamic seal arrangements define a fluidically sealed volume surrounding the rotatable shaft, the fluidically sealed volume containing a second cooling fluid; and a chilling unit connected to the fluid conduit by fluid lines and adapted to cool the first cooling fluid, wherein the chilling unit, the fluid lines, and the fluid conduit define a stationary, closed-loop fluid circuit fluidically sealed from the process environment.

13. The ion implantation system of claim 12, wherein the heat transfer gap has a width in a range of 25 microns to 150 microns.

14. The ion implantation system of claim 12, wherein a fluid pressure of the first cooling fluid is greater than a fluid pressure of the second cooling fluid.

15. The ion implantation system of claim 14, wherein a fluid pressure of the first cooling fluid is in a range of 2,500 Torr to 10,000 Torr and a fluid pressure of the second cooling fluid is in a range of 20 Torr to 60 Torr.

16. The ion implantation system of claim 12, wherein the first cooling fluid is one of nitrogen, helium, and neon.

17. The ion implantation system of claim 12, wherein the second cooling fluid is one of nitrogen, helium, and neon.

18. The ion implantation system of claim 12, wherein the rotatable shaft and the heat sink are formed of the same material.

19. The ion implantation system of claim 12, wherein the rotatable shaft is formed of a first material and the heat sink is formed of a second material different from the first material, wherein a coefficient of thermal expansion of the first material is equal to a coefficient of thermal expansion of the second material.

20. The ion implantation system of claim 12, wherein the first dynamic seal arrangement includes a rotary bearing member affixed to the rotatable shaft and a stationary bearing member surrounding the rotary bearing member and affixed to the heat sink, wherein the rotary bearing member and the stationary bearing member cooperate to form a fluid-tight seal surrounding rotatable shaft while allowing the rotatable shaft to be rotated.

* * * * *